United States Patent [19]

Catsiff et al.

[11] Patent Number: 4,894,413
[45] Date of Patent: Jan. 16, 1990

[54] POLYBUTADIENE-EPOXY-ANHYDRIDE LAMINATING RESINS

[75] Inventors: Ephraim H. Catsiff, Palos Verdes Peninsula; William E. Elias, Redondo Beach, both of Calif.

[73] Assignee: Hughes Aircraft Company, Los Angeles, Calif.

[21] Appl. No.: 107,144

[22] Filed: Oct. 9, 1987

[51] Int. Cl.$^4$ ...................... C08G 59/24; C08L 51/00
[52] U.S. Cl. ........................................ 525/65; 525/117
[58] Field of Search ................................... 525/65, 117

[56] References Cited

U.S. PATENT DOCUMENTS

| | | | |
|---|---|---|---|
| 4,132,697 | 1/1979 | Barie, Jr. et al. | 523/456 |
| 4,167,539 | 9/1979 | Heilman et al. | 525/117 |
| 4,601,944 | 7/1986 | Zussman | 428/251 |

Primary Examiner—Edward A. Miller
Attorney, Agent, or Firm—M. E. Lachman; W. K. Denson-Low

[57] ABSTRACT

Improvement in the method for preparing resin compositions for use as a laminate material in printed wiring boards wherein the resin composition is formed by mixing an epoxy-anhydride prepolymer with maleated polybutadiene and a suitable solvent. The improvement involves preparing the epoxy-anhydride prepolymer using a two step procedure instead of a single step. The two step procedure prevents uncontrolled exothermic reactions from occurring during preparation of commercial quantities of the epoxy-anhydride prepolymer and increases the versatility of the process since different anhydrides can be used in each of the two steps.

5 Claims, No Drawings

POLYBUTADIENE-EPOXY-ANHYDRIDE LAMINATING RESINS

BACKGROUND OF THE INVENTION

This invention was made with support from the Government of the United States of America under Contract number F33615-84-C-1415 awarded by the Department of the Air Force. The U.S. Government has certain rights in this invention.

1. Field of the Invention

The present invention relates generally to laminating resins used in the fabrication of printed wiring boards (PWBs). More specifically, the present invention relates to improved laminating resins based on polyblends of maleated high-vinyl-content polybutadiene and anhydride-extended cycloaliphatic epoxy resin.

2. Description of Related Art

In high-performance aerospace electronic circuitry incorporating solid state devices (e.g. chips) mounted on multilayer printed wiring boards (MLPWBs), a low dielectric constant of the PWB provides significant advantages in certain circuit parameters. Current state-of-the-art PWBs are made from E-glass fabric/epoxy and E-glass fabric/bismaleimide laminates. The nominal dielectric constant for these PWBs is 4.5. If the dielectric constant for these PWBs could be reduced to 3.0 or lower, the circuit performance would improve, and also, a higher packing density of chips on the PWBs would be feasible.

Other properties which the PWB should have concurrently with a low dielectric constant are: (1) low moisture absorption, (2) low dissipation factor, (3) glass transition temperature (Tg) higher than that of epoxies currently used in PWBs, (4) coefficient of thermal expansion (CTE) compatible with requirements for attaching leadless chip carriers (LCCs) fabricated from aluminum oxide, (5) reasonable and practical conditions for fabricating prepreg, (6) capability of being drilled to give clean holes, and (7) cost effectiveness.

The substitution of fibers such as quartz (fused silica) and Kevlar for E-glass can provide the required CTE and a significant reduction of the dielectric constant. However, a further reduction of the dielectric constant to 3.0 and lower requires the use of laminating resins which have a lower dielectric constant than conventional epoxies and bismaleimides. Low dielectric constant and low dissipation factor should be maintained under high humidity conditions.

Characteristics of resins suitable for fabrication of high-temperature PWBs with low dielectric constants include: (1) highly aliphatic (nonpolar) structure, (2) minimal presence of specific structures and reactive end groups that increase polarity, (3) amenability to complete cure, (4) easy processing, and (5) good mechanical properties, thermal stability, and adhesion.

One class of hydrocarbon resins which has been found to be suitable for meeting these goals is thermosetting high-vinyl 1,2-polybutadiene (1,2-PBD) resins. This type of resin has been shown to be an excellent candidate for formulation into laminating resins for low dielectric constant MLPWBs.

Although the 1,2-PBD's have been found to have excellent promise for yielding PWBs with the desired low dielectric constant, they require formulation with other types of resins to improve processability and thermal capability.

For clarification, it is noted that polymerization of commercial butadiene can produce two different polymers, which for convenience are designated 1,2-polybutadiene (1,2-PBD) and 1,4-polybutadiene (1,4-PBD). The structure for each is:

1,4-PBD

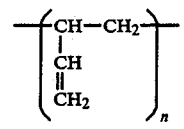

1,2-PBD 1,2-PBD is preferred for use in PWBs because it can cyclize when it is cured by free radicals, whereas 1,4-PBD will not. Such cyclization leads to products with a higher Tg. The commercially available 1,2-PBDs have high vinyl contents (greater than 80 percent) and low molecular weights with associated high cross-link densities.

One formulation having many of the above features is disclosed in U.S. Pat. No. 4,601,944. This laminating resin is an alloy or polyblend of equal weights of two prepolymers. One prepolymer, designated MAPBD, is a maleated high-vinyl-content PBD, such as Ricon 154 1,2-PBD from Colorado Chemical Specialties, Inc. The other prepolymer, designated CH, is an anhydride-extended cycloaliphatic epoxy resin with excess epoxy. During final cure, the two prepolymers are joined by a maleic anhydride (MA)-epoxy reaction, while peroxide-induced cure of the vinyl groups in the PBD raises the Tg to a reported 192° C. The contents of this patent are hereby incorporated by reference.

The above disclosed polyblend provides a useful PWB laminating material. However, problems have been experienced due to the exothermic nature of reactions with the cycloaliphatic constituent and possible uncontrollable reactions.

The threat of a runaway exothermic reaction has presented difficulties with regards to preparation of commercial quantities of this laminating resin. In addition, it would be desireable to increase the Tg of the laminating resin as well as optimize dielectric and thermal properties and processabilty.

SUMMARY OF THE INVENTION

In accordance with the present invention, improved polybutadiene-epoxy-anhydride laminating resins are disclosed which are made by a process wherein the threat of runaway exothermic reaction is greatly reduced. Further, the dielectric constant of the material is reduced without decreasing the processability of the resin, and increases in Tg are obtained.

The present invention is based on the discovery that the epoxy-anhydride prepolymer can be made in a two step process instead of the single step process disclosed in U.S. Pat. No. 4,601,944. The two step process involves mixing a first monoanhydride with a cycloaliphatic epoxy wherein the amount of monoanhydride is less than stoichiometric with respect to the epoxide groups in said cycloaliphatic epoxy. This mixture is reacted in the presence of an initiator for a sufficient time to form a polymer precursor wherein less than half of the epoxide groups have been reacted. The polymer precursor is then mixed with an additional second monoanhydride. An amount of second monoanhydride is used such that a reaction occurs with the remaining unreacted epoxide groups. The second step of this process forms the epoxy-anhydride prepolymer which is then mixed with maleated polybutadiene according to known procedures to form resin compositions for use as a laminate material and printed wiring boards.

The formation of the epoxy-anhydride prepolymer in accordance with the present invention greatly reduces the risk of runaway exothermic reactions during prepolymer formation. In addition, the two step process provides control of resin preparation not possible when the epoxy-anhydride prepolymer is formed in a single step. For example, as a feature of the present invention, the second monoanhydride added to the prepolymer precursor can be different from the first monoanhydride which is initially reacted with the cycloaliphatic epoxy in the first step of the prepolymer formation. Low melting solid monoanhydride such as hexahydrophthalic anhydride may be used as the first monoanhydride with a liquid monoanhydride such as methylhexahydrophthalic anhydride being used as the second monoanhydride. The use of these different monoanhydrides during preparation of the epoxy-anhydride prepolymer provides control over resin formation which is not possible with prior single step procedures.

The above discussed and many other features and attendant advantages of the present invention will become better understood by reference to the following detailed description.

DESCRIPTION OF THE PREFERRED EMBODIMENTS

The present invention is an improvement upon the methods and resins of the type disclosed in U.S. Pat. No. 4,601,944. The polybutadiene-epoxy-anhydride laminating resins disclosed in this patent are produced by combining a prepolymer of a cycloolefin diepoxide and a cycloaliphatic anhydride with a maleated high-vinyl content polybutadiene resin. This combined polymer blend or alloy is then prepregged onto a porous substrate and the resins cocured to form a laminated structure suitable for fabrication of printed wiring boards (PWBs). PWBs incorporating these polybutadiene-epoxy-anhydride laminating resins have been found to meet the requirements of low dielectric constant, low dissipation factor, high glass transition softening point, and high residual modulus at temperatures above 150° C.

Preparation of the above resins in commercial quantities is difficult due to the exothermic nature of the polymerization reaction during formation of the epoxy-anhydride prepolymer. The prepolymer formation is typically carried out in a single, lengthy, difficult to control step in which an uncontrollable exothermic reaction is hard to avoid, especially when commercial quantities are used.

In accordance with the present invention, the single step prepolymer formation is divided into two separate steps. As will be described below, separating formation of the prepolymer into two separate steps provides a number of advantages not possible in a single step process. In addition to reducing the chances for uncontrolled exothermic reaction, the two step process provides for the use of different monoanhydrides, accelerators and initiators during prepolymer formation. The use of different selected and tailored monoanhydrides, accelerators and initiators during prepolymer formation greatly increases the options available in preparing final cured resin matrixes having desired properties.

The first step in preparing the epoxy-anhydride prepolymer involves mixing an aliphatic epoxy with an amount of anhydride which is less than the stoichiometric amount necessary to react with all of the epoxide groups in the aliphatic epoxy. An initiator is added and polymerization is carried out until no more than approximately half of the epoxide groups have been reacted. This prepolymer precursor can be stored for future use or can be used immediately in preparing the final epoxy-anhydride prepolymer. The final prepolymer is prepared by adding additional anhydride to the prepolymer precursor along with a suitable initiator. This anhydride extended prepolymer precursor is then further reacted to form the final epoxy-anhydride prepolymer.

Suitable aliphatic epoxies include cycloaliphatic epoxies such as vinylcyclohexene diepoxide, limonene diepoxide, (3,4-epoxy-cyclohexylmethyl) 3,4-epoxycyclohexanecarboxylate, dicyclopentadiene diepoxide, glycidyl 2,3-epoxycyclopentyl ether, cyclopentenyl ether diepoxide, and 2,3-epoxycyclopentyl 9,10-epoxystearate. The preferred cycloaliphatic epoxy is (3,4-epoxycyclohexylmethyl) 3,4-epoxycyclohexanecarboxylate because it is commercially available from Union Carbide as ERL 4221 and from Ciba-Geigy as CY179.

The anhydrides used in preparing the prepolymer precursor are monoanhydrides such as hexahydrophthalic anhydride, methylhexahydrophthalic anhydride, tetrahydrophthalic anhydride, methyltetrahydrophthalic anhydride, phthalic anhydride, nadic anhydride, and nadic methyl anhydride.

The prepolymer precursor is prepared by reacting the monoanhydride with the cycloaliphatic epoxy in the presence of a suitable initiator. Suitable initiators include alcohols such as methyl alcohol, ethyl alcohol, glycerol, trimethylolpropane, erythritol, pentaerythritol, and propylene glycol, and tertiary amines such as triethylamine. The relative amounts of the various reactants and the polymerization conditions are such that less than 50% of the epoxide groups are reacted. The amount of anhydride should be less than half of the amount that would be stoichiometrically required to react with all epoxide groups. The initiator typically should be present in an amount between 0.1 to 1% by weight of the anhydride-epoxy mixture. Hexahydrophthalic anhydride is the preferred anhydride.

It is possible to prepare prepolymer precursors by combining the aliphatic epoxy with a monoanhydride and then conducting the partial polymerization as described generally above. However, materials which are suitable for use as 'prepolymer precursors' in accordance with the present invention are commercially available from Union Carbide under the designation ERRA 4211 ERRA 4211 is a solid material which is believed to be prepared from ERL 4221 and hexahydrophthalic anhydride (HHPA). In accordance with the requirements of the present invention, ERRA 4211 is prepared by using only enough HHPA to react with less than half of the epoxide groups present in the (3,4-epoxycyclohexylmethyl) 3,4-epoxycyclohexanecarboxylate. ERRA 4211 is incapable of gelation and this prepolymer precursor is shelf stable.

The second step in preparing the prepolymer in accordance with the present invention involves adding additional anhydride to the prepolymer precursor along with a suitable initiator to form the final prepolymer. The additional anhydride can be any of the previously mentioned anhydrides used in the first step. It is preferred that the second anhydride be a liquid anhydride such as methylhexahydrophthalic anhydride. The use of this liquid anhydride in place of the low melting solid HHPA for the epoxide anhydride reaction is preferred because it provides a potential for improving processing characteristics and for promoting higher glass transition temperatures in the cured epoxy.

The final epoxy anhydride prepolymer is then mixed with maleated polybutadiene to form a varnish which includes a suitable catalyst. The resulting polymer blend is applied to coarse fabric or other reinforcements typically used in preparing printed wiring boards. The pre-pregged material is then press cured according to conventional techniques to produce the desired laminates.

As an example of practice, 23 gms. of pulverized ERRA 4211 was placed in a beaker with 7 gms. of methylhexahydrophthalic anhydride and 30 gms. of toluene. The resinous ERRA 4211 was crushed to a maximum particle size of 6 mm (0.25 inch) to facilitate dissolution. In a well-ventilated hood, the beaker was placed in a stabilized oil bath at 95° C. (203° F.) with a stirrer in the open beaker. The ERRA 4211 dissolved, for the most part, in 15 to 20 minutes. Softened resin clumps sticking to the beaker were dislodged as needed. After a 90 minute cook time, much of the toluene had evaporated leaving the final prepolymer. Fifty gms. of methyl ethyl ketone (MEK) was added to the beaker. In about two minutes, the syrupy prepolymer was well-dispersed and the beaker was removed from the oil bath to cool.

Maleated polybutadiene (MAPBD) was prepared according to the procedures set forth in U. S. Pat. No. 4,601,944. The MAPBD solution was 80% solids. 87 gms. of the MAPBD solution was placed in a beaker into which the epoxy-anhydride prepolymer solution was added. Additional MEK was used to wash the prepolymer solution into the blend and dilute the blended varnish to about 45% by weight solids. The varnish was low in viscosity and no viscoelasticity was noted.

2.5 gms, of bis(-butylperoxy)diisopropylbenzene was added to the varnish as the free radical initiator. This initiator is available from Hercules, Inc. under the trade designation ('VULCUP R'). 2.0 gms. of liquid 2,5-dimethyl-2,5-di(t-butylperoxy)hexane was also added as an initiator. This second initiator is sold by Pennwalt, Inc. under the trade name ('LUPERSOL 101'). Additionally, 0.4 gms. of solid ethylmethylimidazole was well powdered and dissolved in the varnish as an accelerator. The varnish was filtered through a paint filter to remove any particulates. This varnish is then ready for application to suitable fabrics to form prepregs for use in forming the laminated PWBs.

In a second example, a much larger batch of prepolymer was prepared. 200 gms. of ERRA 4211 was used instead of the 23 gms. used in the above example. The relative amounts of other ingredients were increased proportionately. No problems with uncontrollable exothermic reactions were experienced. The only difference was that a longer dissolution time was needed in order to dissolve the ERRA 4211 in the anhydridetoluene mixture and the cook time was extended to two hours. The amount of MAPBD and MEK solution were also increased proportionately. The resulting varnish was found to have the same properties as the varnish prepared in the smaller quantities of the first example.

It should be noted that the preferred ratio of MAPBD to epoxy-anhydride prepolymer is about 70:30 by weight.

Laminates were made from the varnish prepared in accordance with the first example. The laminates were prepared by applying the varnish to 13 inch wide strips of woven quartz fabric. The varnish was applied by pulling the quartz fabric through the varnish utilizing a motor-driven impregnator. Two 12-mil thick spacers were used to separate the fabric impregnator rollers and to control the varnish pick-up by the quartz cloth. The cloth was pulled through the varnish and rollers at a rate of approximately 15 inches per minute. The pre-pregged quartz cloth was hung to air-dry for about one half hour, then B-staged at 118° C. (245° F.). The B-staging was carried out in a large circulating oven with a continuous nitrogen purge venting through it. The prepreg was placed in the oven so as to prevent wrinkling. A staging time of six minutes was used to provide a high flow prepreg. The prepreg was weighed to determine resin content and was found to be in the desired range of 54–59% by weight resin. The plies of quartz prepreg were then laminated between sheets of copper foil and press cured for 70 minutes at 204° C. (400° F.). The pressure was maintained at 6.89 MPa (1000 psi) for 15 minutes, after which the pressure was reduced to approximately 3.45 MPa (500 psi). The resin gelled rapidly in less than four minutes. Both copper-clad and unclad laminates were prepared. The copper-clad laminates contained 8 plies while the unclad laminates contained 17 plies. Both laminates used quartz fabric. Reference laminates for comparison were prepared from Kerimid-601 Bismaleimide resin (Rhone-Poulenc) and quartz fabric. Both copper-clad and unclad laminates were prepared. The clad laminates had a ply count of 10, and the unclad laminate had a ply count of 20. The Kerimid-601/quartz laminates were cured for 55–60 minutes at 177° C. (350° F.) in a heated-platen hydraulic press set at 2.76 MPa (400 psi) pressure for the thin copper-clad laminates or 2.07 MPa (300 psi) pressure for the thicker unclad laminates.

Thermophysical, dielectric, and mechanical properties of the two types of laminates were determined. A summary of the results is presented in Tables 1 through 3. The laminates prepared utilizing the prepolymer of the first example are identified as quartz-PBD. The reference laminate is identified as quartz-K-601.

TABLE 1

| PROPERTY | TEST METHOD | QUARTZ-PBD | | Quartz K-601 | |
|---|---|---|---|---|---|
| | | NO. TESTS | AVG RESULTS | NO. TESTS | AVG RESULTS |
| CURED PLY THICKNESS, IN × 10$^3$ | MICROMETER | 5 | 3.60 | 6 | 3.03 |
| FIBER CONTENT | BURNOUT | 9 | 32.6 V % | 6 | 40.6 V % |
| BULK DENSITY, G/CM$^3$ | DISPLACEMENT | 9 | 1.447 | 6 | 1.654 |
| DIELECTRIC CONSTANT | FLUID DIS- | 5 | 3.05 | 6 | 3.89 |

TABLE 1-continued

| PROPERTY | TEST METHOD | QUARTZ-PBD | | Quartz K-601 | |
|---|---|---|---|---|---|
| | | NO. TESTS | AVG RESULTS | NO. TESTS | AVG RESULTS |
| AT 1 MHz | PLACEMENT ASTM D 150 | | | | |
| DISSIPATION FACTOR AT 1 MHz | FLUID DIS-PLACEMENT ASTM D 150 | 5 | 0.0066 | 6 | 0.0049 |
| Tg, TAN δ PEAK, °C. | RHEOMETRICS | 1 | 160 | 1 | >300 |
| COPPER FOIL ADHESION | PEEL | 16 | 8.0 | 16 | 10.6 |
| AVERAGE DURING PULL | STRENGTH, | 15 | 7.4 | 15 | 9.8 |
| MINIMUM DURING PULL | PIW | | | | |

TABLE 2

| PROPERTY | TEST METHOD | QUARTZ-PBD | | QUARTZ K-601 | |
|---|---|---|---|---|---|
| | | NO. TESTS | AVG RESULTS | NO. TESTS | AVG RESULTS |
| COEFFICIENT OF THERMAL EXPANSION, PPM/°C. | QUARTZ DILATOMETRY, | | | | |
| IN PLANE | RANGE, | 1 | 14.1 | 1 | 11.6 |
| THROUGH THICKNESS | 5-150° C. | 1 | 76.3* | 1 | 54.3** |
| MOISTURE ABSORPTION AFTER 24 HOURS IMMERSION AT RT, % | MITSUBISHI MOISTURE METER, AT 170° C. | 2 | 0.49 | 2 | 1.17 |
| PROCESS SOLVENT EXPOSURE, % WT CHANGE | | | | | |
| METHYLENE CHLORIDE | 2 MIN AT RT | 2 | +0.08 | 2 | −0.05 |
| 1% $H_2SO_4$ 3% BORIC ACID | 30 MIN AT 60° C. | 2 | +0.03 | 2 | −0.04 |
| 1% NAOH | 5 MIN AT 90° C. | 2 | −0.004 | 2 | −0.09 |

*CURVILINEAR
**STRAIGHT

TABLE 3

| PROPERTY | TEST METHOD | QUARTZ-PBD | | QUARTZ K-601 | |
|---|---|---|---|---|---|
| | | NO TESTS | AVG RESULTS | NO TESTS | AVG RESULTS |
| FLEXURAL STRENGTH, KSI | ASTM D790 | | | | |
| RT | | 4 | 58.4 | 4 | 112.4 |
| 125° C. | | 4 | 36.2 | 3 | 100.9 |
| 125° C., AGED 200 HR | | 4 | 38.0 | 4 | 94.1 |
| FLEXURAL MODULUS, MSI | ASTM D790 | | | | |
| RT | | 4 | 1.93 | 4 | 2.65 |
| 125° C. | | 4 | 1.49 | 3 | 2.43 |
| 125° C., AGED 200 HR | | 4 | 1.60 | 4 | 2.59 |
| SHORT BEAM SHEAR STRENGTH, KSI | ASTM D2344 | | | | |
| RT | | 8 | 6.1 | 8 | 11.9 |
| 125° C., | | 8 | 4.5 | 8 | 10.4 |
| 125° C., AGED 200 HR | | 8 | 3.2 | 8 | 9.8 |

As can be seen from the test results, the quartz-PBD laminates had desirably lower dielectric constant, bulk density, and moisture absorption than the reference laminate. The reference laminate had higher glass transition temperatures, lower CTE, higher copper foil adhesion, and higher mechanical properties than the quartz-PBD laminates. However, these properties are within acceptable ranges for both laminate types. Two double-sided PWBs, each with a standard test pattern according to MIL-P-55110D (Military Specification, Printed Wiring Boards, General Specification for), were successfully fabricated, one from a PBD/quartz copper-clad laminate and one from a Kerimid-601/quartz copper-clad laminate. Tests conducted on the test patterns included dielectric withstanding voltage, insulation resistance, solderability, and thermal stress of the plated-through holes [288° C. (550° F.) solder float test].

All of the tests were conducted per MIL-P-55110D (boards) and MIL-P-13949F [Military Specification, Plastic Sheet, Laminated, Metal Clad (for Printed Wiring Boards), General Specification for] (copper-clad laminates). The boards proved satisfactory in all respects, with one exception. This exception was evidence of blistering beneath 2.5 cm (1 inch) wide copper foil test strips on the PBD/quartz laminate adjacent to the board area, when the laminate area with the strips was exposed to 218° C. (425° F.) solder fusing conditions.

One explanation for the noted blistering is that the copper foil could have catalyzed decomposition of the peroxides or of peroxide decomposition products remaining in the PBD/quartz formulation in the vicinity of the copper. However, the solder fusing operation produced no visible effects on the PBD/quartz board itself. To demonstrate solderability, components including integrated circuits, resistors, and capacitors were successfully soldered to the two boards.

Having thus described exemplary embodiments of the present invention, it should be noted by those skilled in the art that the within disclosures are exemplary only and that various other alternatives, adaptations, and modifications may be made within the scope of the present invention. Accordingly, the present invention is not limited to the specific embodiments a illustrated herein, but is only limited by the following claims.

What is claimed is:

1. In a method for preparing a resin composition for use as a laminate material in printed wiring boards, wherein said method comprises mixing an epoxy-anhydride prepolymer with maleated polybutadiene and a suitable solvent, wherein the improvement comprises:

preparing said epoxy-anhydride prepolymer by mixing a first solid monoanhydride with a cycloaliphatic epoxy wherein the amount of said first solid monoanhydride in less than one half of stoichiometric with respect to the epoxide groups in said cycloaliphatic epoxy, and reacting said mixture of monoanhydride and cycloaliphatic epoxy in the presence of an initiator for a sufficient time to form a prepolymer precursor wherein less than half of the epoxide groups have been reacted;

mixing said prepolymer precursor with an additional second liquid monoanhydride in an amount sufficient to react with the remaining unreacted epoxide groups to forms said epoxy-anhydride prepolymer for further mixing with said maleated polybutadiene to form said resin composition for use as a laminate material in printed wiring boards.

2. The improvement according to claim 1 wherein said monoanhydride is hexahydrophthalic anhydride.

3. The improvement according to claim 1 wherein said first monoanhydride is hexahydrophthalic anhydride and said second monoanhydride is methylhexahydrophthalic anhydride.

4. The improvement according to claim 1 wherein said epoxy resin is a diepoxide.

5. The improvement according to claim 4 wherein said epoxy resin is (3,4-epoxy-cyclohexylmethyl) 3,4-epoxycyclohexanecarboxylate.

* * * * *